(12) United States Patent
Cortes et al.

(10) Patent No.: US 11,458,845 B2
(45) Date of Patent: Oct. 4, 2022

(54) HIGH VOLTAGE CIRCUIT AND METHOD FOR CONTROLLING A CONTACTOR IN ELECTRIC VEHICLES

(71) Applicant: Vitesco Technologies USA, LLC, Auburn Hills, MI (US)

(72) Inventors: Emmanuel Barajas Cortes, Dearborn, MI (US); Alberto Jimenez-Hernandez, Royal Oak, MI (US)

(73) Assignee: Vitesco Technologies USA, LLC, Auburn Hills, MI (US)

( * ) Notice: Subject to any disclaimer, the term of this patent is extended or adjusted under 35 U.S.C. 154(b) by 0 days.

(21) Appl. No.: 17/074,375

(22) Filed: Oct. 19, 2020

(65) Prior Publication Data
US 2022/0118856 A1 Apr. 21, 2022

(51) Int. Cl.
*H02P 27/04* (2016.01)
*B60L 3/00* (2019.01)
*B60L 15/08* (2006.01)

(52) U.S. Cl.
CPC ............ *B60L 3/0084* (2013.01); *B60L 15/08* (2013.01)

(58) Field of Classification Search
CPC ............ H02P 2209/09; G05B 19/2218; B60L 3/0084; B60L 15/08; B60L 3/04; B60L 3/00
See application file for complete search history.

(56) References Cited

U.S. PATENT DOCUMENTS

| 2010/0289439 A1 | 11/2010 | Kitanaka et al. |
| 2012/0212168 A1 | 1/2012 | Mailley et al. |
| 2018/0134279 A1 | 5/2018 | Barkdull et al. |
| 2021/0104902 A1 | 4/2021 | Mutsumi et al. |

FOREIGN PATENT DOCUMENTS

| JP | 2006020380 A | 1/2006 | |
| KR | 2017061730 A * | 6/2017 | .......... B60L 11/1811 |
| WO | WO-2017031115 A1 * | 2/2017 | .............. B60L 1/00 |
| WO | 2019159598 A1 | 8/2019 | |

OTHER PUBLICATIONS

International Search Report and Written Opinion dated Oct. 13, 2021 from corresponding International Patent Application No. PCT/US2021/054756.

* cited by examiner

*Primary Examiner* — Karen Masih

(57) ABSTRACT

A control circuit and method are disclosed for controlling a contactor in a motor vehicle. The control circuit includes a driver circuit having an output to couple to a control terminal of a contactor, the driver circuit having a supply input and a control input. A Boolean logic gate has an input coupled to a safety disable control signal, a second input and an output coupled to the control input of the driver circuit. A hold circuit has a first input coupled a loss of propulsion signal, a second input coupled to an pulse width modulation (PWM) control signal and an output coupled to the second input of the Boolean logic gate. Based upon the output of the loss of propulsion detection circuit, the output of the output latch circuit is either maintained at a prior Boolean logic state of the output of the output latch circuit or is based on the PWM control signal.

14 Claims, 5 Drawing Sheets

US 11,458,845 B2

HIGH VOLTAGE CIRCUIT AND METHOD FOR CONTROLLING A CONTACTOR IN ELECTRIC VEHICLES

FIELD OF INVENTION

The present invention generally relates to control circuitry for contactors, and particularly to control circuitry for contactors in electric vehicles.

BACKGROUND

The state of the art in electrical vehicles requires two or more switching elements in the system commonly called "contactors." These contactors open or close as needed by the electrical high voltage circuit responsible for vehicle propulsion. Historically these contactors are controlled by electronic module using different combinations of high side drivers (HSD) or low side drivers (LSD), for example, ON/OFF HSD, a pulse-width modulation (PWM) LSD, PWM HSD, ON/OFF LSD, single HSD or single LSD. Regardless the HSD-LSD combination used, the common characteristic is that the drivers are directly controlled by the main microcontroller in the system. In case of a loss of the main microcontroller, the nature of the circuit is to immediately disable the contactor driver and move the system into a safe state, which includes opening the contactors 7.

FIG. 1 illustrates a conventional control apparatus and/or control module 1 for controlling one or more contactors disposed between a high voltage source and a high voltage load which, in this case, is the vehicle propulsion system of an electric vehicle or hybrid electric vehicle. Control apparatus 1 includes a driver circuit 3, illustrated as a high side driver circuit, which generates a control signal 5 that is connected to a control terminal of contactor 7. Driver circuit 3 is powered by battery supply voltage Vbatt. A safety gate, which in this case is implemented as a logic AND gate, receives as inputs a loss of propulsion signal 207, a safety disable signal 209 and a pulse-width modulation (PWM) control signal 205 from a microcontroller (not shown) operatively associated with control apparatus 1. Loss of propulsion signal 207 is generated by a device other than the main microcontroller which controls contactor 7, and may be asserted responsive to the detection of a loss of propulsion of the motor vehicle or to the unintended reset of the main microcontroller. The safety disable signal 209, which is generated by a redundant secondary supervisory device/microcontroller or the main microcontroller which control the contactors, serves to control driver circuit 3 and immediately open contactor 7 so as to electrically isolate the high voltage source and the high voltage load. This may occur if the microcontroller loses power or is otherwise lost from facilitating control of contactor 7. The PWM control signal 205 is provided by the main microcontroller during normal operation.

Opening contactor 7 in response to a failure avoids further hazards commonly rated as high as Automotive Safety Integrity Level D (ASIL-D). However, there exists a failure scenario in which an uncommanded and/or unexpected opening of contactor(s) 7 may lead to an unsafe state in the electric or hybrid electric vehicle. Specifically, opening contactors 7 may lead to an unexpected loss of propulsion which may be dangerous at high speeds. Depending upon the specific conditions considered by vehicle manufacturers in their Hazard Analysis and Risk Assessment (HARA), this scenario may be rated as high as ASIL-D. For this reason, in an electric vehicle the safety goal to "avoid unexpected loss of propulsion" may be found. This safety goal, avoiding unexpected loss of propulsion, may conflict with other safety goals of the control system for the electric vehicle which requires immediately opening contactors 7 in the case of failure.

SUMMARY

Example embodiments of the present disclosure overcome shortcomings in existing electric vehicle control systems by reconciling the potential hazard of an unexpected loss of propulsion with the need to open contactors 7 in response to system failure. In an example embodiment, a control circuit for a contactor in an electric vehicle is disclosed, including a driver circuit having an output to couple to a control terminal of at least one contactor, the driver circuit having a supply input and a control input; and a Boolean logic gate having an input coupled to a safety disable control signal, a second input and an output coupled to the control input of the driver circuit. A hold circuit has a first input coupled a loss of propulsion signal, a second input coupled to a PWM control signal and an output coupled to the second input of the Boolean logic gate.

In one embodiment, the hold circuit includes a loss of propulsion detection circuit having an input coupled to the first input of the hold circuit and an output. The hold circuit also includes an output latch circuit having a first input coupled to the output of the loss of propulsion detection circuit and an output coupled to the second input of the Boolean logic gate. In one aspect, the loss of propulsion detection circuit includes a monostable multivibrator circuit which generates a pulse output having a predetermined duration, the pulse output being responsive to a triggering edge of the loss of propulsion signal. In another aspect, the monostable multivibrator circuit includes a retriggerable monostable multivibrator circuit.

In an embodiment, the loss of propulsion detection circuit includes at least two discrete electric or electronic components coupled to the monostable multivibrator circuit, and the predetermined duration is based upon characteristic values of the at least two discrete electrical or electronic components.

The output latch circuit includes a multiplexer circuit having a first selection input coupled to the output of the loss of propulsion detection circuit, a second selection input coupled to a logical complement of the output of the loss of propulsion detection circuit, a first data input coupled to the output of the multiplexer circuit and a second data input coupled to the PWM control signal, with the output of the multiplexer circuit being the output of the output latch circuit. When the first selection input is in a first logic state, the first data input of the multiplexer circuit is coupled to the output thereof, and when the second selection input is in the first logic state, the output of the multiplexer circuit is based on the PWM control signal. Based upon the output of the loss of propulsion detection circuit, the output of the output latch circuit is either maintained at a prior Boolean logic state of the output of the output latch circuit or is based on the PWM control signal.

In an example embodiment, the hold circuit includes a second latch circuit having a first input corresponding to the first input of the hold circuit, a second input coupled to a first control signal, and an output corresponding to the output of the hold circuit. The output of the second latch is held in a first Boolean logic state responsive to the loss of propulsion signal and is in a second Boolean logic state responsive to the first control signal. In one aspect, the second latch circuit includes a D-type flip flop circuit having a set input and data input coupled to a power supply voltage, a clock input coupled to the loss of propulsion signal and a reset input coupled to the first control signal.

The contactor is connected between a high voltage source and a high voltage load in an electric vehicle.

In another embodiment, a method of controlling a contactor disposed between a high voltage source and a high voltage load in an electric vehicle is disclosed. The method includes sensing whether a loss of propulsion signal indicates a loss of propulsion event is occurring; generating a first control signal responsive to the loss of propulsion signal; and generating a latched output signal for controlling a contactor based upon a logic state of the first control signal and a logic state of a PWM control signal.

The first control signal includes a pulse having a predetermined pulsewidth, and generating the first control signal includes generating the pulse responsive to a triggering edge of the loss of propulsion signal.

Generating the latched output signal includes latching the latched output signal when the first control signal is in a first Boolean logic state, and generating as the latched output signal the PWM control signal when the first control signal is in a second Boolean logic state. Generating the latched output signal includes multiplexing at the latched output signal the latched output signal when the first control signal is in a first Boolean logic state, and the PWM control signal when the first control signal is in the second Boolean logic state.

Generating the first control signal includes generating the first control signal as a latched control signal, the latched control signal changing logic state when a control input signal is in a first logic state and unchanging when the control input signal is in a second logic state.

BRIEF DESCRIPTION OF THE DRAWINGS

Aspects of the invention will be explained in detail below with reference to exemplary embodiments in conjunction with the drawings, in which.

DETAILED DESCRIPTION

The following description of the example embodiment(s) is merely exemplary in nature and is in no way intended to limit the invention, its application, or uses. In the figures and throughout the detailed description, the same reference numbers are used to identify identical or similar elements. For the sake of clarity, the elements are not shown to scale unless otherwise specified.

The example embodiments are generally directed to reconciling the opening of contactors in a high voltage system for an electric vehicle responsive to a failure, such as microcontroller failure, with the dangers of propulsion loss when the vehicle is traveling at high speeds due to opening the contactors. In general terms, the example embodiments provide electronic solutions capable of holding the previous state of the contactor for a period of time in order to avoid an unexpected loss of propulsion in the system, without affecting the normal operation of the contactor in an emergency. This advantageously results in delaying any unexpected loss of propulsion so as to, among other things, allow the system to alert the vehicle driver about the propulsion loss prior to propulsion loss actually occurring.

Figure 1:
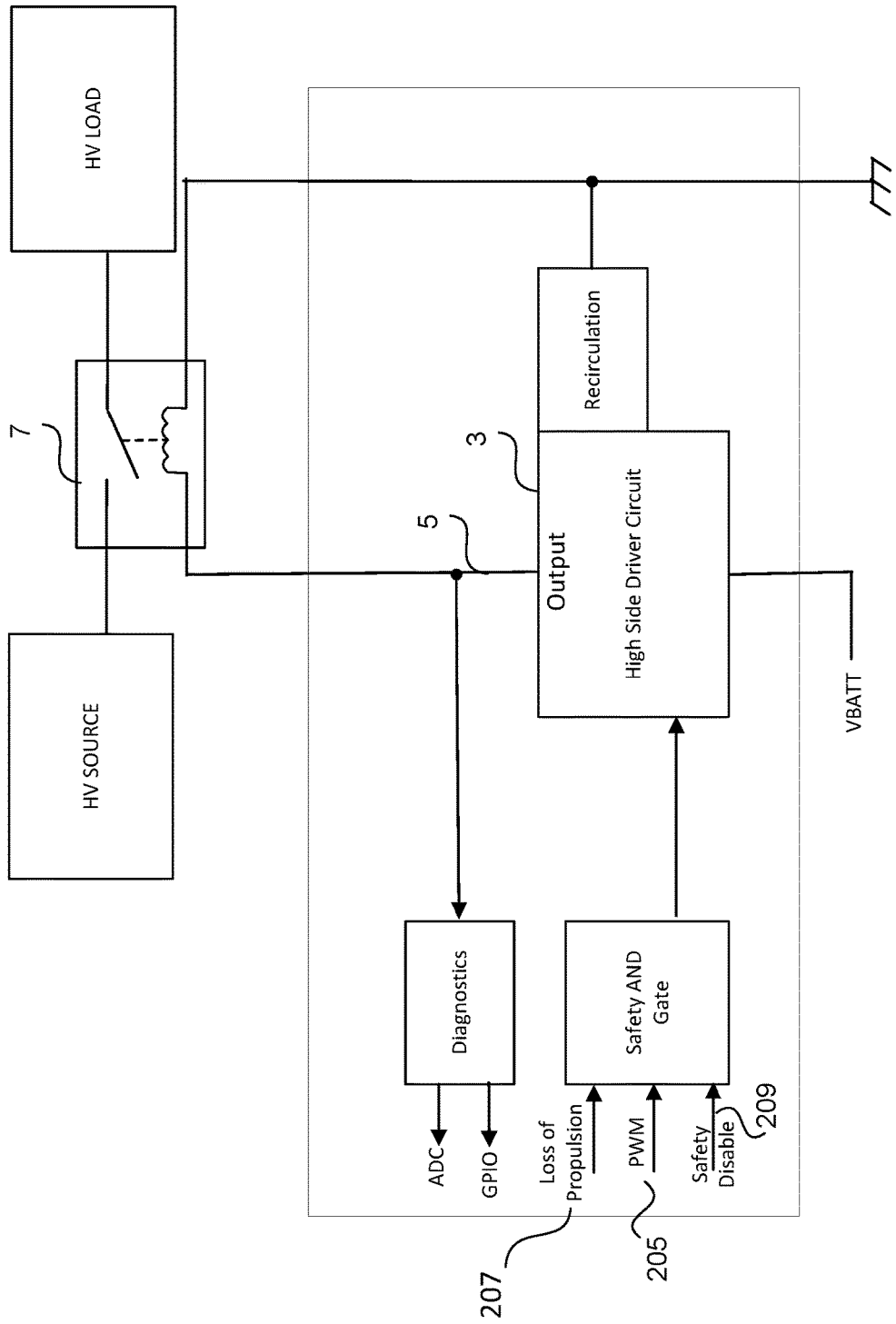
FIG. 1 is a simplified block diagram of a conventional control apparatus for controlling a contactor disposed between a high voltage source and a high voltage load.
Figure 2:
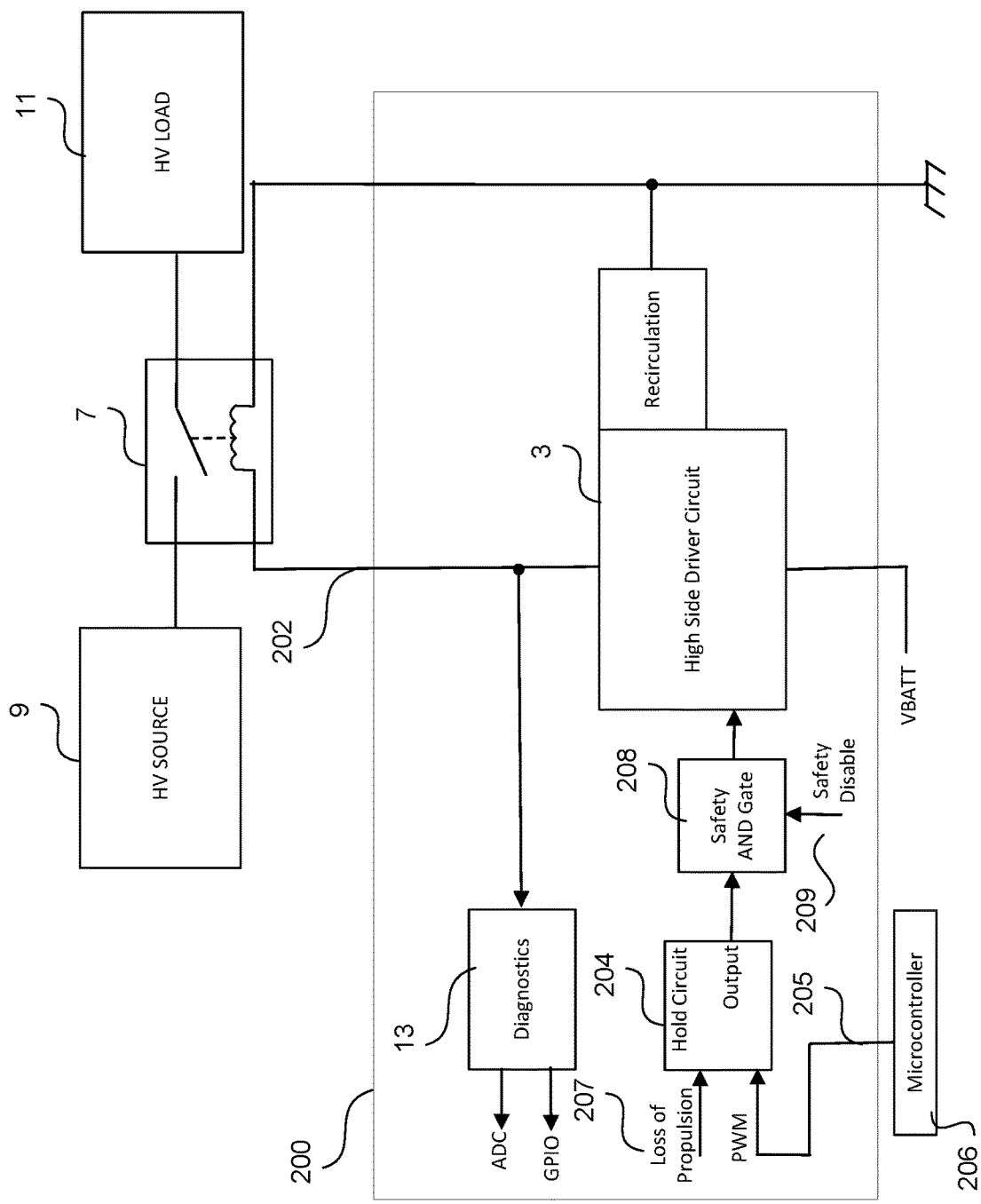
FIG. 2 is a simplified block diagram of a control apparatus for controlling a contactor disposed between a high voltage source and a high voltage load, according to an example embodiment.

FIG. 2 illustrates a control apparatus or system 200 according to an example embodiment. Control apparatus 200 may form at least part of a control module for an electric vehicle. Control apparatus 200 provides a control signal 202 which controls the state of contactor 7. In this embodiment, contactor 7 is disposed between a high voltage source 9, such as a group of batteries which combined provide a high voltage, and a high voltage load 11, such as the propulsion system for the electric vehicle. Contactor 7 may be one of a number of contactors used in association with high voltage source 9 and/or high voltage load 11, in which case contactor 7 may represent a plurality of contactors 7.

Control apparatus 200 includes driver circuit 3 for generating control signal 202. In the embodiment illustrated, driver circuit 3 is a high side driver circuit, but it is understood that driver circuit 3 may have any one of a number of different topologies, as discussed above. A diagnostics block 13 provides feedback concerning the control of contactor 7 to other modules within the vehicle control system.

Control apparatus 200 further includes hold circuit 204 which receives PWM control signal 205 generated and transmitted by a microcontroller 206 of the electric vehicle as well as loss of propulsion signal 207 which is generated during a failure or imminent failure such as, for example, responsive to the detection of a loss of propulsion or imminent loss of propulsion of the electric or hybrid electric vehicle. In the illustrated embodiment, the loss of propulsion signal 207 is generated by a device other than microcontroller 206 and may be asserted responsive to the unintended reset of microcontroller 206. Hold circuit 204 generates an output signal that is applied to safety logic 208 which is implemented as a logic AND gate. Safety logic 208 additionally receives safety disable signal 209 for disabling contactor 7. In this embodiment, the safety disable signal 209 is generated by an independent (relative to microcontroller 206) monitoring device, watchdog timer circuit or other secondary supervisory device (not shown). Safety disable signal 209 serves to control driver circuit 3 and immediately open contactor 7 so as to electrically isolate the high voltage source 9 and the high voltage load 11.

Microcontroller 206 includes one or more processor cores as well as memory, both volatile and nonvolatile, that may store program code as instructions which, when executed by the one or more processor cores, cause microcontroller 206 to perform operations including, in this instance, the control one or more contactors 7. The control of contactor 7 may form part of controlling, by microcontroller 26, the high voltage load 11 (e.g., the vehicle's propulsion system). It is understood that microcontroller 206 may include any number of different microcontroller architectures. The memory may be embedded in microcontroller 206, external thereto, or both embedded in and external to microcontroller 206. In an alternative embodiment, microcontroller 206 is implemented as a field programmable gate array (FPGA) or is a state-machined based circuit.

Hold circuit 204 receives PWM control signal 205 from microcontroller 206 and loss of propulsion signal 207 and generates an output signal at an output of hold circuit 204 which delays loss of propulsion signal 207 from propagating to safety logic 208. In this example embodiment, the amount of delay is predetermined and is set to allow for the vehicle driver to be alerted of an upcoming disruption in vehicle propulsion so that the driver may take appropriate measures before the disruption, thereby avoiding a potentially dangerous scenario from occurring.

Figure 3:
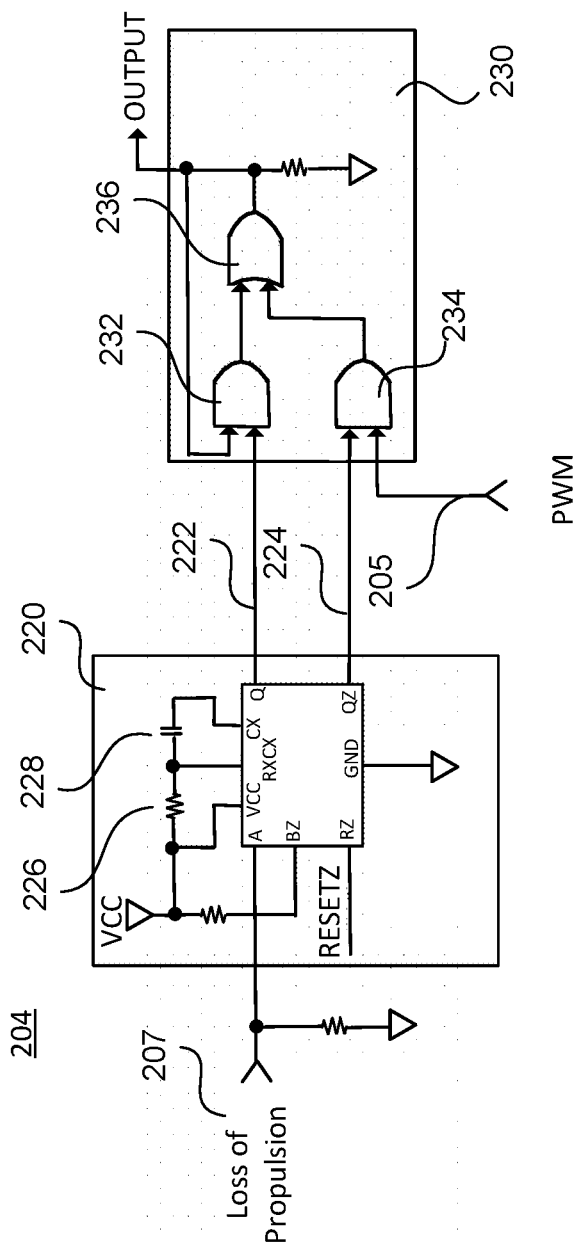
FIG. 3 is a schematic diagram of a hold circuit of the control apparatus of FIG. 2 according to an example embodiment.

FIG. 3 illustrates an implementation of hold circuit 204 according to an example embodiment. Hold circuit 204 includes a loss of propulsion detection circuit 220 which detects a triggering edge of the digital loss of propulsion signal 207 and generates a pulse as output signal 222 and the logical complement (inverse) output signal 224. Loss of propulsion detection circuit 220 performs as an monostable multivibrator and/or "one-shot" which generates a pulse responsive to a triggering edge of the input of the circuit. The illustrated implementation of loss of propulsion detection circuit 220 uses a retriggerable monostable multivibrator having part number 74HC4538 and manufactured by, for example, Texas Instruments, Inc. (as part number CD74HC4538). In this implementation, the duration of the generated pulse is based upon the time constant calculated by the product of the resistance (characteristic value) of resistor 226 and the capacitance (characteristic value) of capacitor 228, and particularly is based on 0.7 of such product. It is understood that the duration of the pulse generated by loss of propulsion detection circuit 220 may vary based upon system requirements by changing the capacitance and/or resistance of capacitor 228 and resistor 226, respectively. It is further understood that loss of propulsion detection circuit 220 may have different implementations and utilize different parts and electrical or electronic components.

With continued reference to FIG. 3, hold circuit 204 further includes an output latch circuit 230 which is configured to maintain its present latched state upon receipt of the generated pulse from loss of propulsion detection circuit 220, and to output a signal based upon the PWM control signal 205 generated by microcontroller 206 when there is no generated pulse from loss of propulsion detection circuit 220. The illustrated implementation of output latch circuit 230 is of a multiplexer circuit in which either the output of output latch circuit 230 is selected and fed back and passed to the output or the PWM control signal 205 is selected and passed to the output of output latch circuit 230. The selection of either the fed back output signal or the PWM control signal 205 is made by the output signals 222, 224 generated by loss of propulsion detection circuit 220. The specific implementation of output latch circuit 230 in this embodiment includes two logic AND gates 232, 234 and logic OR gate 236. Logic AND gate 232 receives as its inputs output signal 222 generated by loss of propulsion detection circuit 220 and the output of output latch circuit 230. Logic AND gate 234 receives at its inputs the output signal 224 generated by loss of propulsion detection circuit 220 and the PWM control signal 205. The output of logic AND gates 232, 234 are connected to the inputs of logic OR gate 236. The output of logic OR gate 236 drives the output of output latch circuit 230.

As can be seen, when the pulse generated by loss of propulsion detection circuit 220 at output signal 222 is asserted (i.e., becomes a logic high or "1" value), the output of output latch circuit 230 is fed back and is propagated through logic AND gate 232 and logic OR gate 236. This maintains output latch circuit 230 in a latched state in which the output is maintained in its current state. During this time, the output signal 224 is de-asserted (i.e., becomes a logic low or "0" value) which causes logic AND gate 234 to output a logic low or "0" value so as to have no effect on the output of logic OR gate 236.

Conversely, when there is no pulse appearing on output signal 222, i.e., it is in the logic low or "0" state, the output of logic AND gate 232 is at a logic low or "0" state such that it has no effect on the output of logic OR gate 236. During this time in which there is no pulse generated by loss of propulsion detection circuit 220, the output signal 224 is driven to a logic high or "1" value which allows for PWM control signal 205 to propagate through logic AND gate 234 and logic OR gate 236 to the output of output latch circuit 230. As a result, hold circuit 204 maintains its current output for a predetermined period of time upon loss of propulsion signal 207 being asserted. Only after the predetermined period of time has elapsed can microcontroller 206 control the state of contactor 7 via PWM control signal 205.

Hold circuit 204 of FIG. 3 advantageously sets a hardware hold time limit for controlling (i.e., turning off or opening) contactor 7 in case of a loss of microcontroller 206. Contactor 7 may be switched off/opened which moves the system to a safe state only after alerting the vehicle driver if microcontroller 206 does not return to its operational state before the pulse time expires and does not affect the normal operation of contactor 7 for other conditions compared to other solutions which are based upon RC delays of PWM control signal 205.

Figure 4:
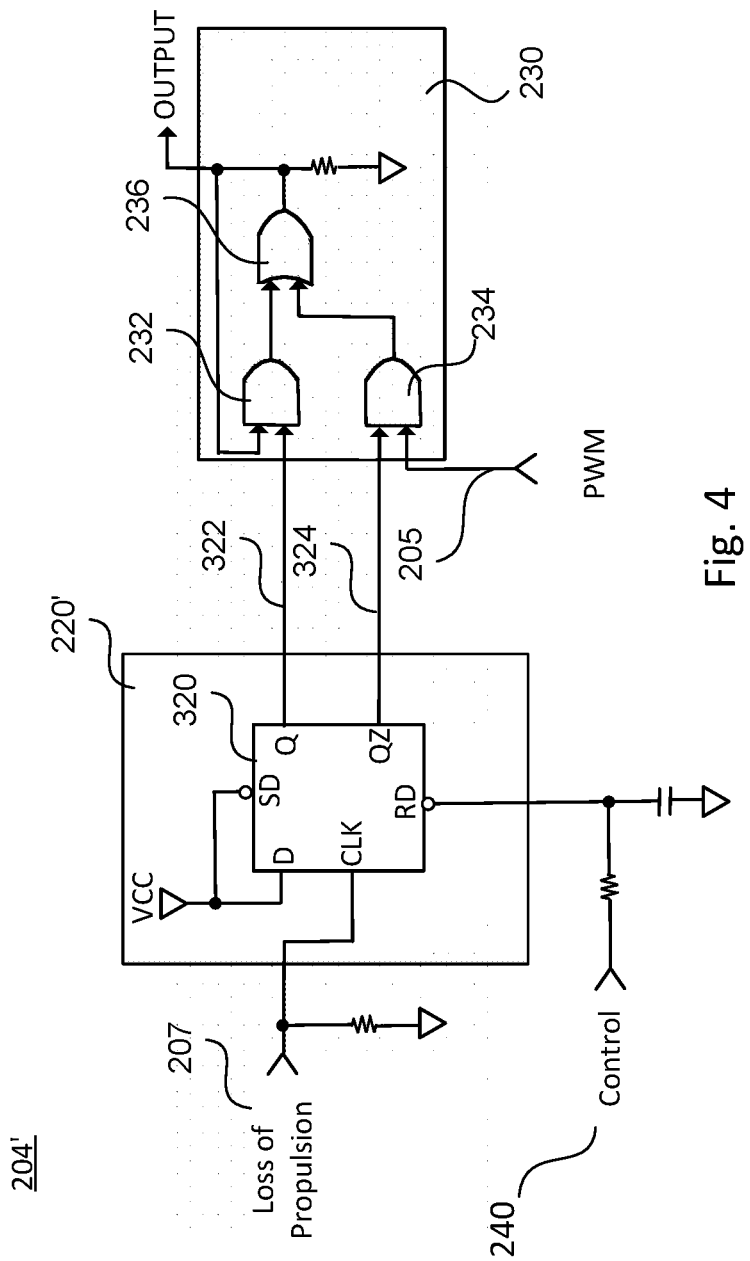
FIG. 4 is a schematic diagram of a hold circuit of the control apparatus of FIG. 2 according to another example embodiment.

FIG. 4 shows an implementation of hold circuit 204' according to a second example embodiment, including loss of propulsion detection circuit 220' and output latch circuit 230. Loss of propulsion detection circuit 220' performs as a latch circuit. In one implementation, loss of propulsion detection circuit 220' is a D-type flip flop circuit 320, such as flip flop part 74HC74, configured to operate as a latch circuit by having the clock input (CLK) connected to loss of propulsion signal 207, the data input (D) and set input (SD) connected to Vcc and/or a logic high or "1" state, and the reset input (RD) connected to a control signal 240, which initializes and/or re-initializes D-type flip flop circuit 320 to a known state. Output signals 322 and (logical complement) 324 toggle once the flip flop circuit 320 is triggered by a rising edge of loss of propulsion signal 207. Flip flop circuit 320 remains in its latched state until microcontroller 206, which generates control signal 240, drives control signal 240 to the logic low or "0" state, at which point the output 322 is driven to the logic low state and the output 324 is driven to the logic high state.

Output latch circuit 230 of hold circuit 204' in FIG. 4 has the same implementation as output latch circuit 230 of hold circuit 204 in FIG. 3.

In operation, when loss of propulsion signal 207 is asserted (i.e., transitions from a logic low state to a logic high state) and with control signal 240 in the logic high state, output signal 322 is driven to the logic high state and (logic complement) output signal 324 is driven to the logic low state. This causes the output of output latch circuit 230 to be fed back and propagate through logic AND gate 232 and logic OR gate 236 to the output of output latch circuit 230, thereby causing a delay in loss of propulsion signal 207 from affecting the control of contactor 7 to turn off contactor 7. The output of output latch circuit 230 remains in this state until control signal 240 resets flip flop 320 (by transitioning from a logic high value to a logic low value) which causes the output 322 to be driven to the logic low state and the output 324 to be driven to the logic high state. At this point, the PWM control signal 205 is able to propagate through logic AND gate 234 and logic OR gate 236 for use in controlling contactor 7.

In the embodiment of hold circuit 204' shown in FIG. 4, there is no programmed delay period in which the output of output latch circuit 230 is latched and/or maintained in its current state, as in the case of the operation of hold circuit 204 of FIG. 3 which has, as discussed above, the predetermined delay duration set in hardware (capacitor 228 and resistor 226). The absence of no predetermined delay period in the operation of hold circuit 204' is because the predetermined delay period is seen in the timing of control signal 240 in transitioning from the logic high state to the logic low state by microcontroller 206, relative to the rising edge of loss of propulsion signal 207. Hold circuit 204' of FIG. 4 requires intervention by microcontroller 206 to retake control of the output of hold circuit 204' (and thus control of contactor 7) which is convenient because microcontroller 206 may postpone the loss of propulsion for a longer (or varied) period of time until microcontroller 206 retakes control to actively control the state of contactor 7.

Figure 5:
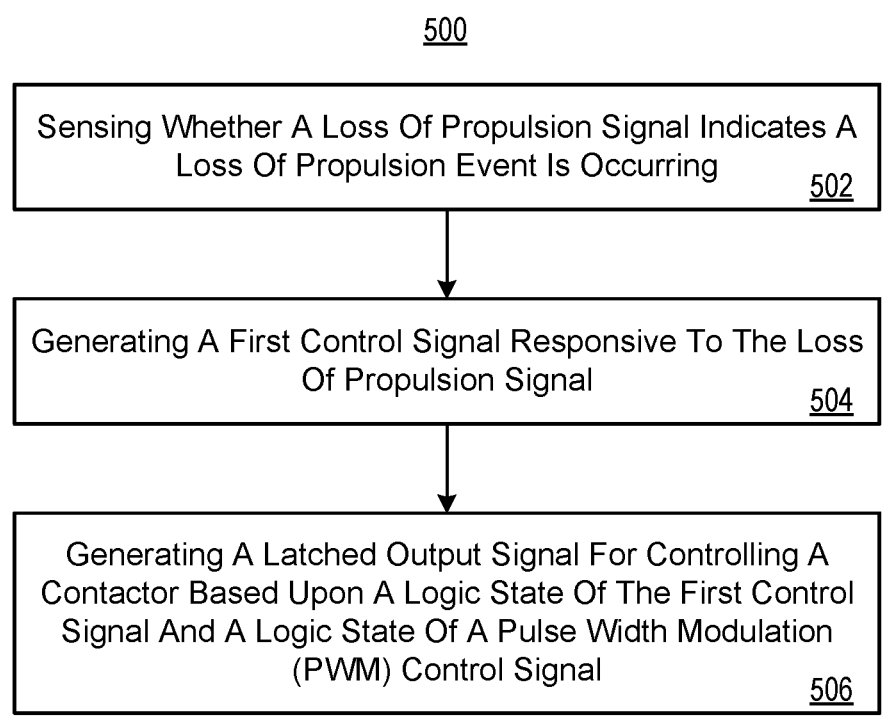
FIG. 5 is an exemplary arrangement of operations for a method of controlling a contactor disposed between a high voltage source and a high voltage load in an electric vehicle.

FIG. 5 provides an example arrangement of operations for a method 500 of controlling a contactor disposed between a high voltage source and a high voltage load in an electric vehicle using FIGS. 2-4. At block 502, the method 500 includes sensing whether a loss of propulsion signal indicates a loss of propulsion event is occurring. At block 504, the method 500 includes generating a first control signal responsive to the loss of propulsion signal. At block 506, the method 500 includes generating a latched output signal for controlling a contactor based upon a logic state of the first control signal and a logic state of a pulse width modulation (PWM) control signal.

In some embodiments, the first control signal includes a pulse having a predetermined pulsewidth, and generating the first control signal includes generating the pulse responsive to a triggering edge of the loss of propulsion signal.

In other embodiments, generating the latched output signal includes latching the latched output signal when the first control signal is in a first logic state, and generating as the latched output signal the PWM control signal when the first control signal is in a second logic state.

In some embodiment, generating the latched output signal includes multiplexing at the latched output signal the latched output signal when the first control signal is in a first logic state, and the PWM control signal when the first control signal is in a second logic state.

In some embodiments, generating the first control signal includes generating the first control signal as a latched control signal, the latched control signal changing logic state when a control input signal is in a first logic state and unchanging when the control input signal is in a second logic state.

The example embodiments have been described herein in an illustrative manner, and it is to be understood that the terminology which has been used is intended to be in the nature of words of description rather than of limitation. Obviously, many modifications and variations of the invention are possible in light of the above teachings. The description above is merely exemplary in nature and, thus, variations may be made thereto without departing from the spirit and scope of the invention as defined in the appended claims.

What is claimed is:

1. A control circuit for a contactor in an electric vehicle, comprising:
   a driver circuit having an output to couple to a control terminal of a contactor, the driver circuit having a supply input and a control input;
   a logic gate having an input coupled to a safety disable control signal, a second input and an output coupled to the control input of the driver circuit; and
   a hold circuit having a first input coupled to a loss of propulsion signal, a second input coupled to a pulse width modulation (PWM) control signal and an output coupled to the second input of the logic gate,
   wherein the hold circuit comprises a loss of propulsion detection circuit having an input coupled to the first input of the hold circuit and an output, and an output latch circuit having a first input coupled to the output of the loss of propulsion detection circuit and an output coupled to the second input of the logic gate.

2. The control circuit of claim 1, wherein the loss of propulsion detection circuit comprises a monostable multivibrator circuit which generates a pulse output having a predetermined duration, the pulse output being responsive to a triggering edge of the loss of propulsion signal.

3. The control circuit claim 2, wherein the monostable multivibrator circuit comprises a retriggerable monostable multivibrator circuit.

4. The control circuit of claim 2, wherein the loss of propulsion detection circuit comprises at least two discrete electric or electronic components coupled to the monostable multivibrator circuit, and the predetermined duration is based upon characteristic values of the at least two discrete electrical or electronic components.

5. The control circuit of claim 1, wherein the output latch circuit comprises a multiplexer circuit having a first selection input coupled to the output of the loss of propulsion detection circuit, a second selection input coupled to a logical complement of the output of the loss of propulsion detection circuit, a first data input coupled to the output of the multiplexer circuit and a second data input coupled to the PWM control signal, the output of the multiplexer circuit comprises the output of the output latch circuit.

6. The control circuit of claim 5, wherein when the first selection input is in a first logic state, the first data input of the multiplexer circuit is coupled to the output thereof, and when the second selection input is in the first logic state, the output of the multiplexer circuit comprises the PWM control signal.

7. The control circuit of claim 1, wherein based upon the output of the loss of propulsion detection circuit, the output of the output latch circuit is either maintained at a prior logic state of the output of the output latch circuit or is based on the PWM control signal.

8. The control circuit of claim 1, wherein the loss of propulsion detection circuit comprises a second latch circuit having a first input corresponding to the first input of the hold circuit, a second input coupled to a control signal, and an output corresponding to the output of the loss of propulsion detection circuit, the output of the second latch being held in a first logic state responsive to the loss of propulsion signal and being in a second logic state responsive to the control signal.

9. The control circuit of claim 8, wherein the second latch circuit comprises a D-type flip flop circuit having a set input and data input coupled to a power supply voltage, a clock input coupled to the loss of propulsion signal and a reset input coupled to the control signal.

10. The control circuit of claim 1, wherein the contactor is connected between a high voltage source and a high voltage load in an electric vehicle.

11. A method of controlling a contactor disposed between a high voltage source and a high voltage load in an electric vehicle, the method comprising:
sensing whether a loss of propulsion signal indicates a loss of propulsion event is occurring;
generating a first control signal responsive to the loss of propulsion signal, the first control signal comprises a pulse having a predetermined pulsewidth;
generating a latched output signal for controlling a contactor based upon a logic state of the first control signal and a logic state of a pulse width modulation (PWM) control signal; and
generating the first control signal comprises generating the pulse responsive to a triggering edge of the loss of propulsion signal.

12. The method of claim 11, wherein generating the latched output signal comprises latching the latched output signal when the first control signal is in a first logic state, and generating as the latched output signal the PWM control signal when the first control signal is in a second logic state.

13. A method of controlling a contactor disposed between a high voltage source and a high voltage load in an electric vehicle, the method comprising:
sensing whether a loss of propulsion signal indicates a loss of propulsion event is occurring;
generating a first control signal responsive to the loss of propulsion signal; and
generating a latched output signal for controlling a contactor based upon a logic state of the first control signal and a logic state of a pulse width modulation (PWM) control signal,
wherein generating the latched output signal comprises multiplexing at the latched output signal the latched output signal when the first control signal is in a first logic state, and the PWM control signal when the first control signal is in a second logic state.

14. The method of claim 13, wherein generating the first control signal comprises generating the first control signal as a latched control signal, the latched control signal changing logic state when a control input signal is in a first logic state and unchanging when the control input signal is in a second logic state.

* * * * *